United States Patent [19]

Hsu

[11] Patent Number: 5,946,573
[45] Date of Patent: *Aug. 31, 1999

[54] SELF-ALIGNED SILICIDE (SALICIDE) PROCESS FOR ELECTROSTATIC DISCHARGE (ESD) PROTECTION

[75] Inventor: Chen-Chung Hsu, Taichung, Taiwan

[73] Assignee: United Microelectronics Corp., Taiwan

[ * ] Notice: This patent is subject to a terminal disclaimer.

[21] Appl. No.: 08/862,427

[22] Filed: May 24, 1997

[30] Foreign Application Priority Data

Jan. 24, 1997 [TW] Taiwan .................................. 86100812

[51] Int. Cl.$^6$ ................................ H01L 21/8234
[52] U.S. Cl. ....................... 438/275; 438/281; 438/301; 438/592
[58] Field of Search .................................. 438/275, 281, 438/301, 592

[56] References Cited

U.S. PATENT DOCUMENTS

| | | | |
|---|---|---|---|
| 5,021,853 | 6/1991 | Mistry | 257/357 |
| 5,374,565 | 12/1994 | Hsue et al. | 438/275 |
| 5,416,036 | 5/1995 | Hsue | 438/275 |
| 5,455,444 | 10/1995 | Hsue | 257/413 |
| 5,516,717 | 5/1996 | Hsu | 438/275 |
| 5,585,299 | 12/1996 | Hsu | 438/275 |
| 5,635,746 | 6/1997 | Kimura et al. | 257/382 |

OTHER PUBLICATIONS

Wolf et al., Silicon Processing for the VLSI Era, vol. 1: Process Technology, pp. 535–536, 1986.

*Primary Examiner*—Richard Booth
*Assistant Examiner*—John Murphy
*Attorney, Agent, or Firm*—Finnegan, Henderson, Farabow, Garrett & Dunner, L.L.P.

[57] ABSTRACT

A method of forming an electrostatic discharge protection device having increased electrostatic discharge responsiveness in lightly-doped source-drain areas and a silicide layer, wherein the silicide layer is not etched so to prevent defects in the lightly-doped source-drain areas.

7 Claims, 6 Drawing Sheets

SELF-ALIGNED SILICIDE (SALICIDE) PROCESS FOR ELECTROSTATIC DISCHARGE (ESD) PROTECTION

BACKGROUND OF THE INVENTION

1. Field of the Invention

The invention relates generally to electrostatic discharge (ESD) protection for an integrated circuit (IC), and more particularly, to a self-aligned silicide (SALICIDE) process for improving the ESD protection capability of an integrated circuit.

2. Description of Related Art

During handling of integrated circuits, operators or IC transport equipment generate electrostatic charges due to turboelectric effect. These electrostatic charges may seriously damage the IC.

A metal oxide semiconductor field-effect transistor (MOSFET) IC is most susceptible to electrostatic discharge due to its high input resistance and low breakdown voltage. As a result, an ESD protection device is typically attached to a MOSFET IC where electrostatic discharge occurs most frequently, e.g., at an I/O port, to prevent destruction of a discharge path of the IC.

FIGS. 1A–1G illustrate the conventional process of forming an electrostatic discharge protection device.

As shown in FIG. 1A, the conventional process includes the step of providing a silicon substrate 10 with an internal circuit area 12 and an electrostatic discharge protection area 14. Both areas 12, 14 comprise at least one polysilicon gate electrode 16a and 16b, respectively, and lightly-doped areas 18a and 18b, respectively, formed beside polysilicon gate electrode 16a, 16b, wherein gate electrode 16a and area 18a and gate electrode 16b and area 18b represent source-drain areas of internal circuit area 12 and electrostatic discharge protection area 14, respectively.

Referring to FIGS. 1B and 1C, the conventional process further includes the steps of depositing a silicon dioxide layer 20 on the surface of silicon substrate 10, and etching silicon dioxide layer 20 to form polysilicon gate spacers 22 for internal circuit area 12 and electrostatic discharge protection area 14. Using polysilicon gate spacers 22 as a mask, the conventional process further includes using ion implantation to form heavily-doped areas 21a, 21b in internal circuit area 12 and electrostatic discharge protecting area 14, wherein the source-drain areas form lightly doped drains (N+ areas).

FIGS. 1D and 1E illustrate the process of forming a self-aligned silicide layer. The process comprises the steps of sputtering a titanium layer 24 on the surface of substrate 10 so to chemically react with the Si material of substrate 10 and to form a silicon titanium layer 26. The titanium contacting a nonpolysilicon surface of the device and the titanium contacting the substrate surface but not affected by the chemical reaction, are subsequently removed using a selective etching solution.

Finally, as shown in FIGS. 1F and 1G, the conventional process further includes the steps of depositing a dielectric layer 28 on the entire device and forming contact windows 30 in dielectric layer 28.

In the conventional process for making an electrostatic discharge protection device, the source-drain areas are formed as lightly-doped drain (LDD) structures so to prevent a short channel effect in the internal circuitry. However, these LDD structures increase the short channel effect, which decrease the electrostatic discharge responsiveness of the electronic discharge protection device. Thus, if a large current is supplied in conventional ICs, then the electrostatic discharge protection device must provide a path for rapid discharge.

Further, in the conventional process for making ESD protection devices, the self-aligned silicide step forms a silicide layer on the surface of the gate electrode, improving the conductivity of the polysilicon gate electrode of the internal circuit area and preventing a high resistance in the polysilicon gate electrode. However, the silicide layer also reduces the electrostatic discharge responsiveness of the electrostatic discharge protection device. Thus, the benefits achieved by the silicide layer in the internal circuit is a disadvantage in conventional electrostatic discharge protection devices.

Finally, in the conventional process for making ESD protection devices, the silicide layer remaining on the surfaces of the source-drain areas in the electrostatic discharge protection area must be removed by etching. However, this etching damages the source-drain areas, forming defects therein.

SUMMARY OF THE INVENTION

It is therefore an object of the present invention to provide a method of forming an electrostatic discharge protection device having increased electrostatic discharge responsiveness in the lightly-doped source-drain areas and the silicide layer. Another object of the present invention is to provide a method of forming an electrostatic discharge protection device in which the silicide layer does not need to be etched and, thus, preventing defects in the source-drain areas.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method of forming an integrated circuit having an electrostatic discharge (ESD) protection device, the method including the steps of: providing an internal circuit area and an electrostatic discharge protection area in a semiconductor substrate, wherein each area comprises transistors having a gate and a pair of lightly-doped source and drain regions; forming a dielectric layer over the surface of the semiconductor substrate; forming a photoresist layer over the dielectric layer, the photoresist layer being patterned to cover only the electrostatic discharge protection area; etching the dielectric layer using the photoresist layer as a mask, so to form a sidewall spacer for the gate of the internal circuit area; forming a pair of heavily-doped source and drain regions in the internal circuit area by performing a first ion implantation using the photoresist layer and the sidewall spacer as a mask; forming a metal layer over exposed surfaces of the internal circuit area and the dielectric layer provided on the electrostatic discharge protection area; removing the photoresist layer and a portion of the metal layer over the electrostatic discharge protection area using a lift-off process; removing the dielectric layer over the electrostatic discharge protection area; forming another pair of heavily-doped source and drain regions in the electrostatic discharge protection area by performing a second ion implantation using the metal layer as a mask; and performing a self-aligned silicide process by annealing the semiconductor substrate.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1A:
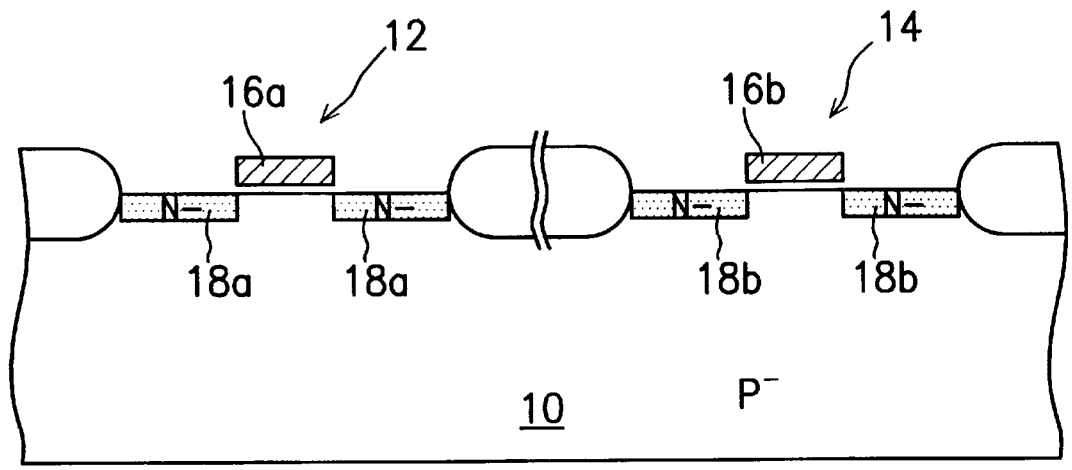
FIGS. 1A–1G are cross-sectional views showing a conventional process of forming an electrostatic discharge protection device.
Figure 1B:
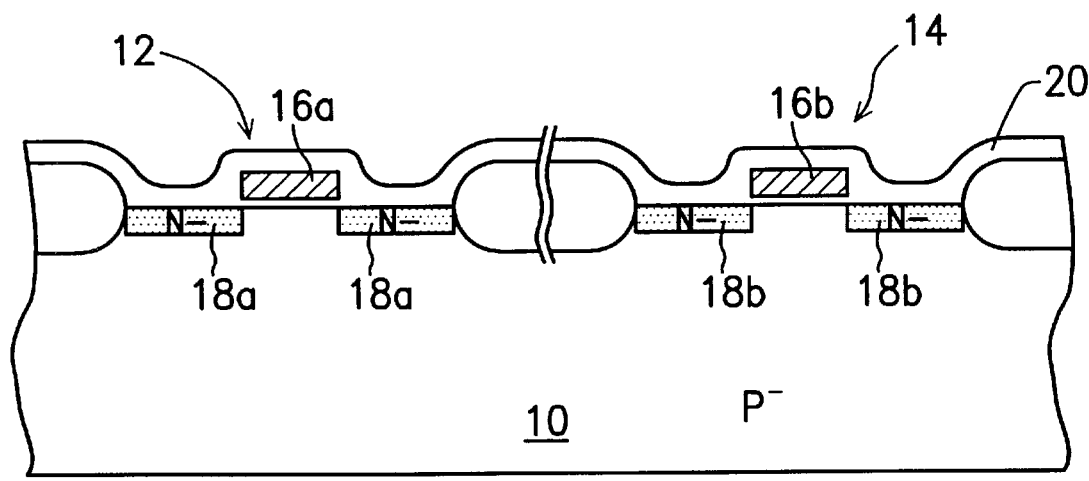
Figure 1C:
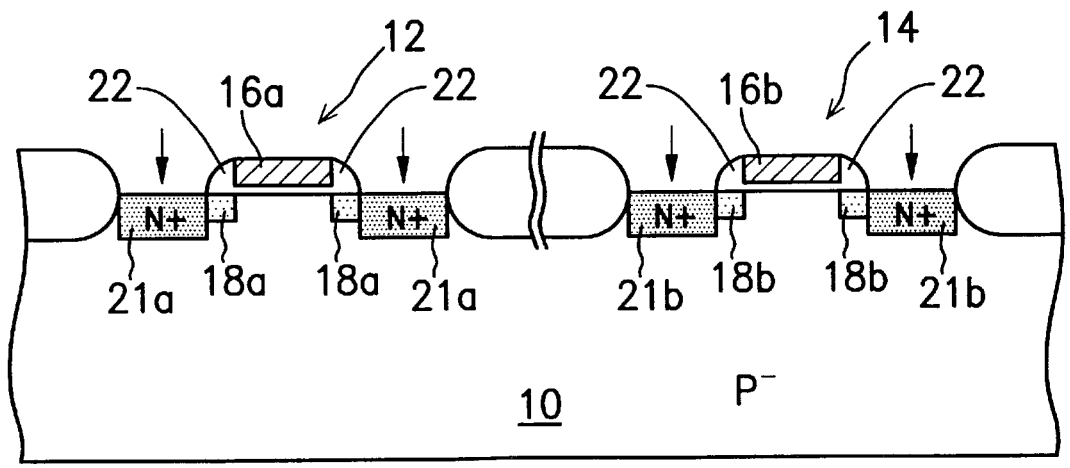
Figure 1D:
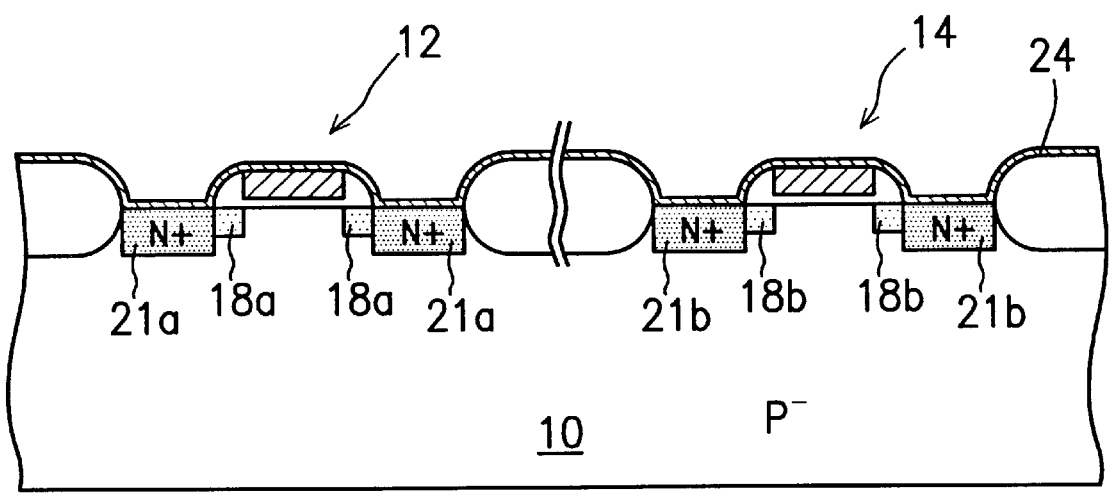
Figure 1E:
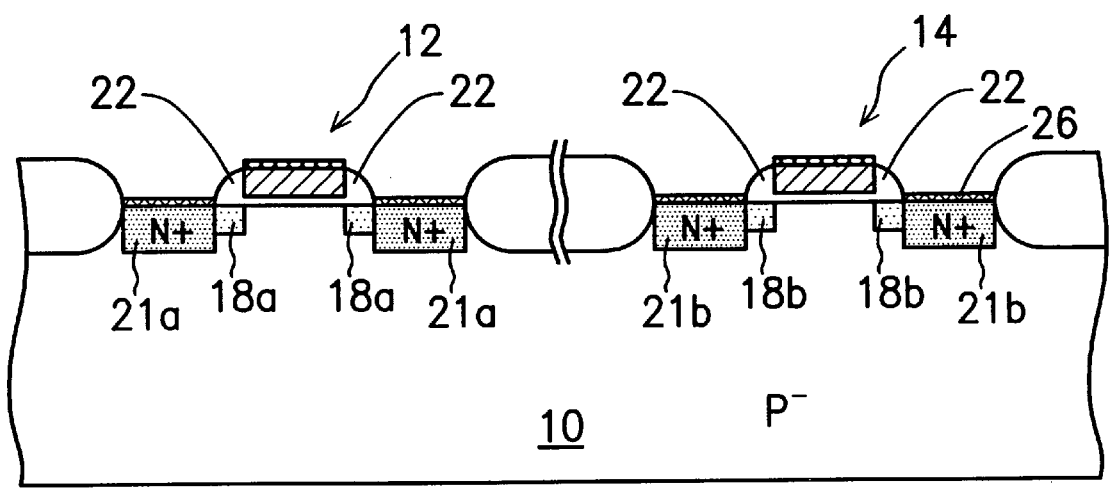
Figure 1F:
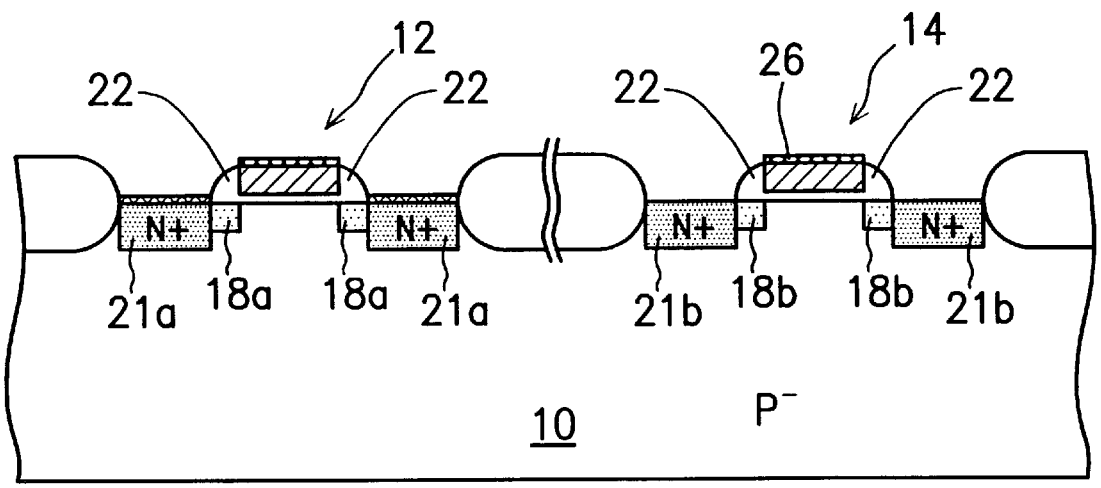
Figure 1G:
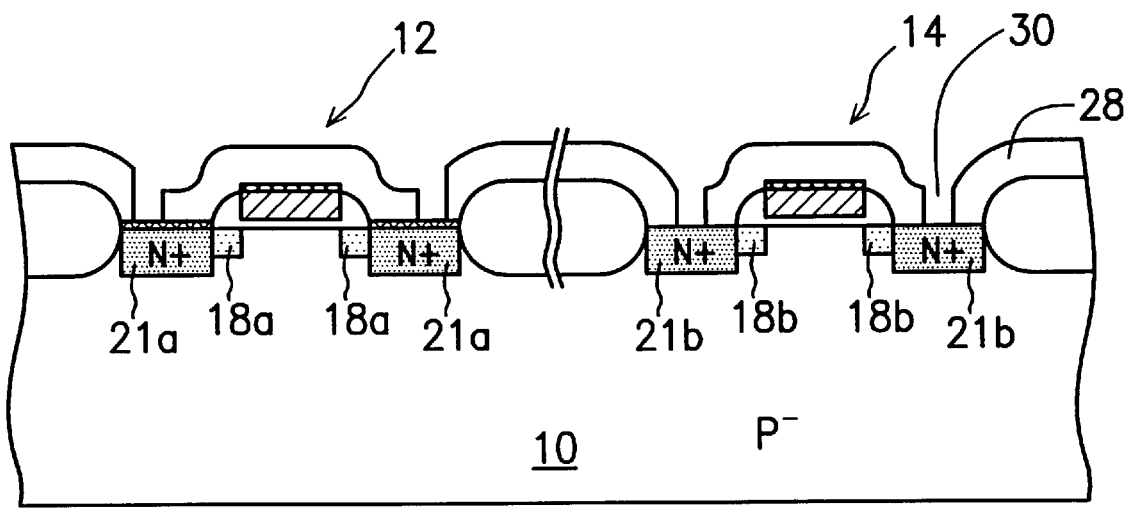
Figure 2A:
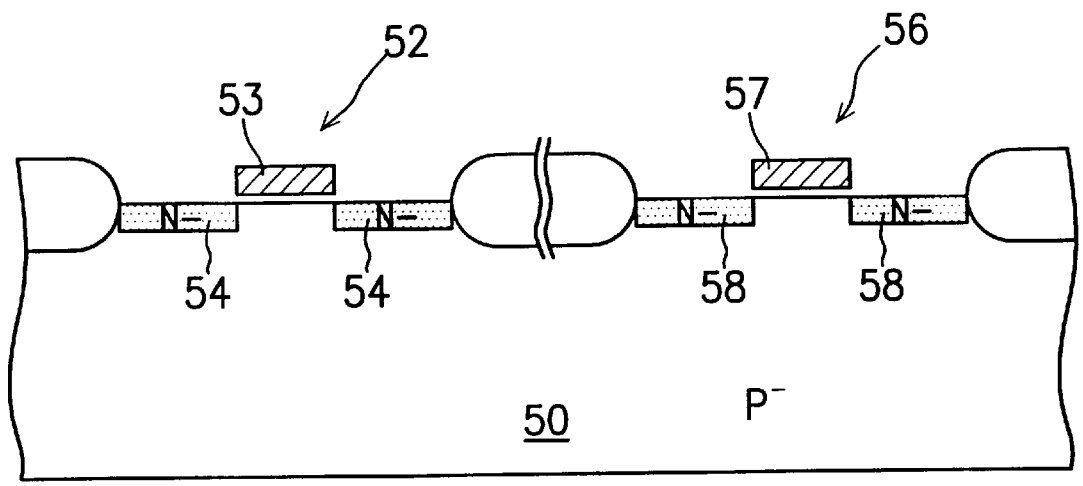
FIGS. 2A–2G are cross-sectional views showing a process of forming an electrostatic discharge protection device in accordance with the present invention.

Referring to FIG. 2A, the process of the present invention includes the step of providing a substrate 50, such as, for example, a semiconductor substrate or a silicon substrate, with an internal circuit area 52 and an electrostatic discharge protection area 56. If a P-type silicon substrate is utilized, then internal circuit area 52 includes at least one polysilicon gate electrode 53 and N-type lightly-doped areas 54 formed adjacent polysilicon gate electrode 53. Similarly, electrostatic discharge protection area 56 includes at least one polysilicon gate electrode 57 and N-type lightly-doped areas 58 formed adjacent polysilicon gate electrode 57.

Figure 2B:
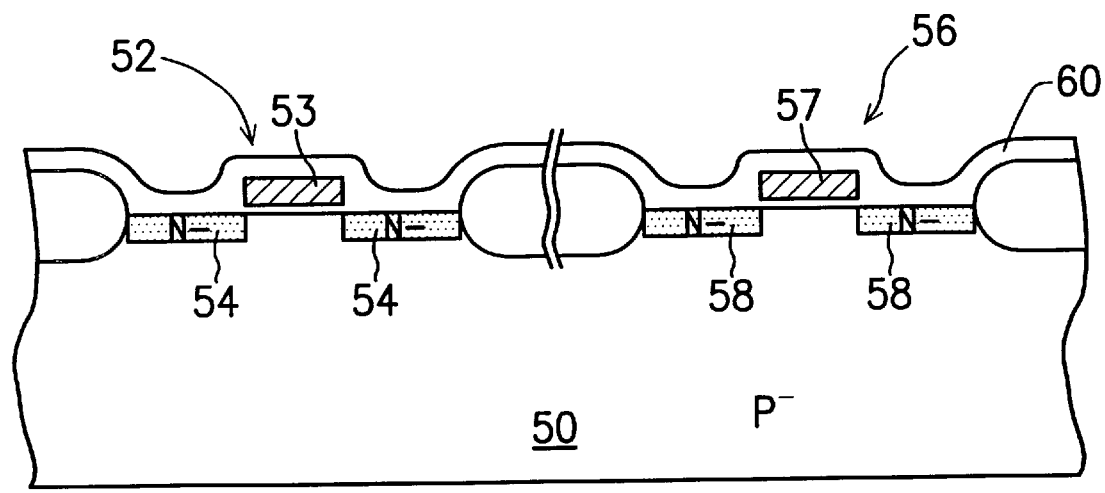

As shown in FIG. 2B, the process of the present invention further includes the step of depositing a dielectric layer 60 on the silicon substrate 50. For example, the step comprises depositing a silicon dioxide layer with a low-pressure chemical-vapor deposition (LPCVD) process to simultaneously cover internal circuit area 52 and electrostatic discharge protection area 56.

Figure 2C:
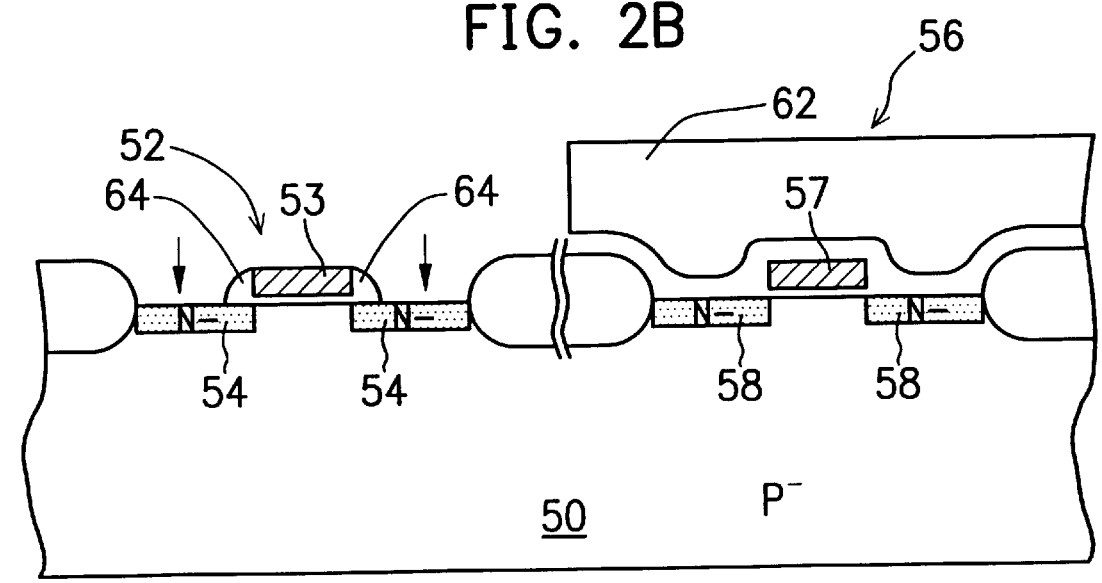

The process, as shown in FIG. 2C, also comprises the steps of forming a photoresist layer 62 on dielectric layer 60, and patterning photoresist layer 60 to cover only the surface of the electrostatic discharge protection area 56. Then, using the photoresist layer 62 as a mask, polysilicon gate spacers 64 are formed in the internal circuit area 52 by etching dielectric layer 60.

Figure 2D:
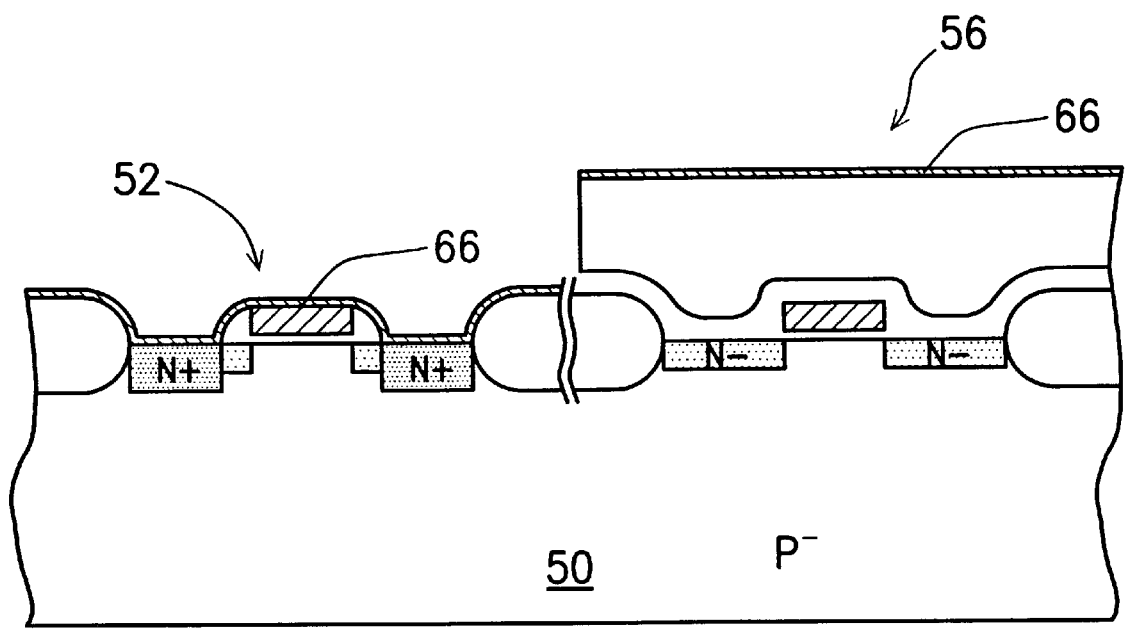

Referring to FIG. 2D, the process further comprises sputtering a metal layer 66, such as titanium, on internal circuit area 52 and electrostatic discharge protection area 56. Metal layer 66 chemically reacts with silicon (Si) material on the surface of internal circuit area 52, for example, the surfaces of the lightly doped source-drain areas and the polysilicon gate electrode, to form a silicide layer. Further, as shown in FIG. 2E, a lift-off technique simultaneously removes the portion of metal layer 66 on photoresist layer 66 and the photoresist layer 62 itself.

Preferably the lift-off technique used for removing the photoresist layer is similar to the one disclosed in published paper entitled "Metallization Approaches Using Lift-Off And Spin-On Glass" by Mr. Pei-Lin Pai and Mr. William G. Oldham (presented at the 1985 Kodak Microelectronics Seminar). The lift-off technique involves depositing a layer of predetermined material on a photoresist mask layer. For example, a predetermined metal layer or other material is sputtered to fill predetermined contact windows or to cover most of the surface of the photoresist layer. A selective organic solution, such as AZ developer or acetone, is subsequently used to chemically react with the uncovered photoresist material. The photoresist material reacts with the organic solution to form a gel-like material that interfaces with residual photoresist material. Thus, the photoresist layer and the metal layer can be lifted-off in one step. The reaction rate of the lift-off technique is influenced by the etching solution used, temperature, the method of depositing the photoresist layer, and the length of reaction time.

Figure 2E:
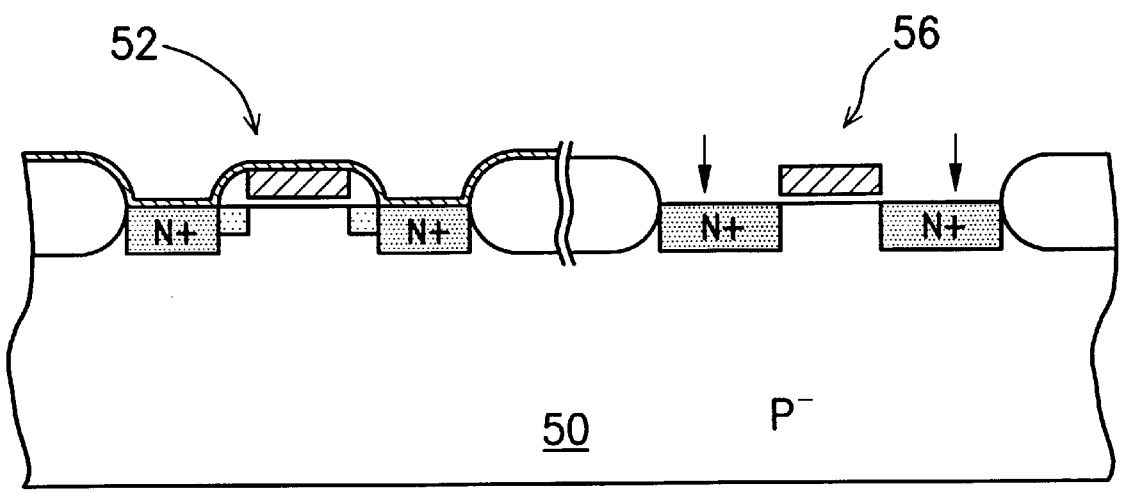

As shown in FIG. 2E, dielectric layer 60 over electrostatic discharge protection area 56 is etched, leaving only the polysilicon gate electrode 57. Furthermore, using polysilicon gate electrode 57 as a mask, heavily doped source-drain areas are formed by ion implantation in the lightly doped areas of electrostatic discharge protection area 56.

Figure 2F:
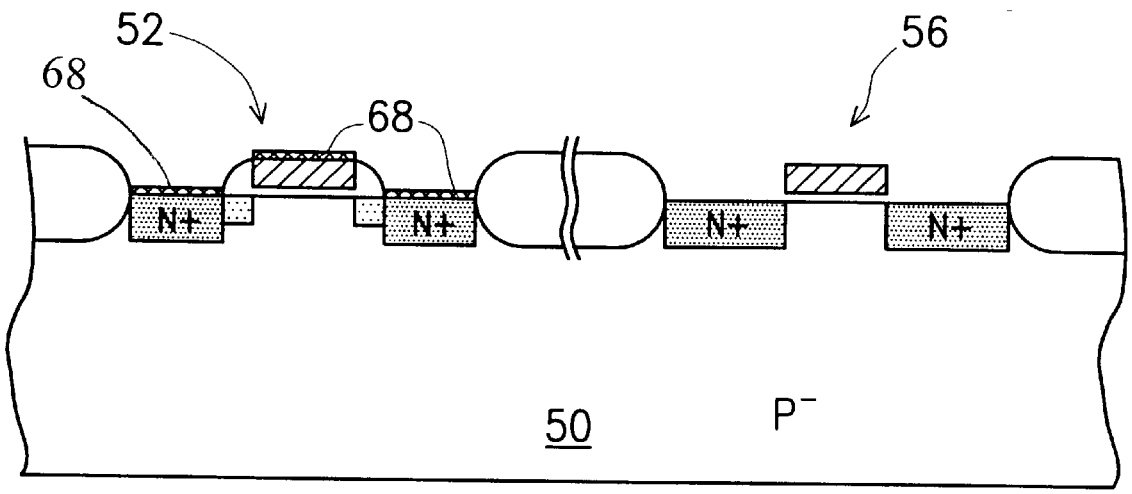
Figure 2G:
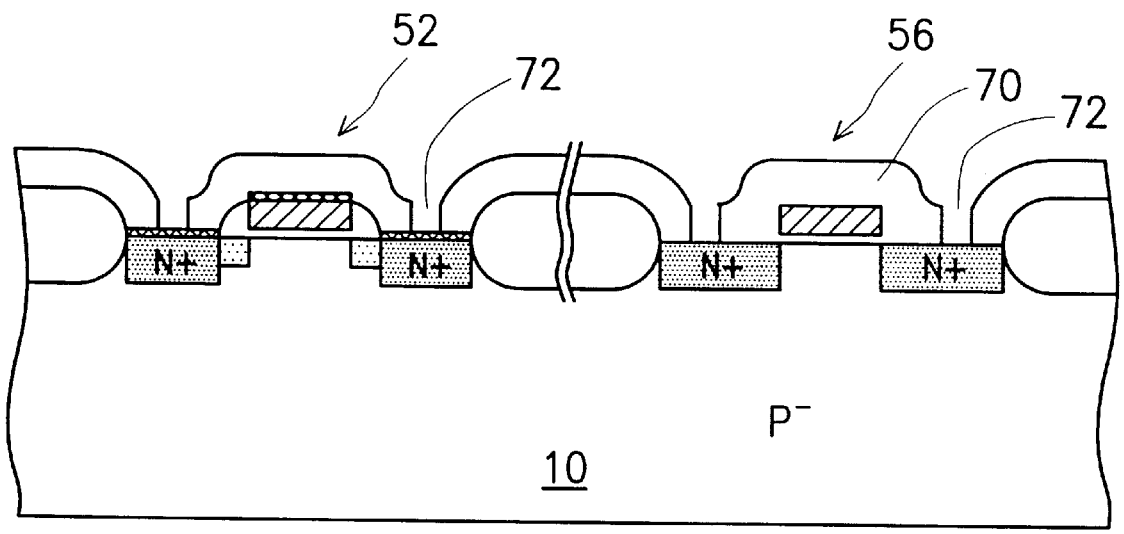

Referring to FIG. 2F, metal layer 66 preferably comprises a titanium layer that chemically reacts with Si material surfaces, such as the surfaces of the lightly doped source-drain areas and the surface of the polysilicon gate electrode, to form a silicon titanium layer 68. Subsequently, a selective etching solution removes the titanium on polysilicon gate spacers 64 and any residual titanium that did not chemically react.

The method according to the present invention further comprises the steps of depositing a dielectric layer 70 internal circuit area 52 and electrostatic discharge protection area 56, and forming contact windows 72 in dielectric layer 70 so to provide a circuit having greater electrostatic discharge responsiveness.

It will be apparent to those skilled in the art that various modifications and variations can be made to the seal of the present invention without departing from the scope or spirit of the invention. Thus, it is intended that the present invention cover the modifications and variations of this invention provided they come within the scope of the appended claims and their equivalents.

What is claimed is:

1. A method of forming an integrated circuit having an electrostatic discharge (ESD) protection device, comprising the steps of:

providing an internal circuit area and an electrostatic discharge protection area in a semiconductor substrate, wherein each area comprises transistors having a gate and a pair of lightly-doped source and drain regions;

forming a dielectric layer over the surface of said semiconductor substrate;

forming a photoresist layer over said dielectric layer, said photoresist layer being patterned to cover only said electrostatic discharge protection area;

etching said dielectric layer using said photoresist layer as a mask, so to form a sidewall spacer for the gate of said internal circuit area;

forming a pair of heavily-doped source and drain regions in said internal circuit area by performing a first ion implantation using said photoresist layer and said sidewall spacer as a mask;

forming a metal layer over exposed surfaces of said internal circuit area and said dielectric layer provided on said electrostatic discharge protection area;

removing said photoresist layer and a portion of said metal layer over said electrostatic discharge protection area using a lift-off process;

removing said dielectric layer over said electrostatic discharge protection area;

forming another pair of heavily-doped source and drain regions in said electrostatic discharge protection area by performing a second ion implantation using said gate as a mask; and performing a self-aligned silicide process by annealing said semiconductor substrate.

2. The method according to claim 1, wherein said semiconductor substrate comprises a silicon wafer.

3. The method according to claim 1, wherein said semiconductor substrate is a P-type substrate and said lightly-doped source and drain regions are N-type.

4. The method according to claim 1, wherein said semiconductor substrate is an N-type substrate and said lightly-doped source and drain regions are P-type.

5. The method according to claim 1, wherein said dielectric layer comprises a silicon dioxide layer.

6. The method according to claim 1, wherein said metal layer is formed by a sputtering process.

7. The method according to claim 1, wherein said metal layer comprises a titanium layer.

* * * * *